(12) United States Patent
Ueno et al.

(10) Patent No.: US 9,584,142 B2
(45) Date of Patent: Feb. 28, 2017

(54) FRACTIONAL N FREQUENCY SYNTHESIZER AND SETTING METHOD THEREOF

(71) Applicants: Icom Incorporated, Osaka (JP); LAPIS Semiconductor Co., Ltd., Yokohama (JP)

(72) Inventors: Yasuo Ueno, Osaka (JP); Hiroji Akahori, Yokohama (JP)

(73) Assignee: Icom Incorporated, Osaka (JP)

( * ) Notice: Subject to any disclaimer, the term of this patent is extended or adjusted under 35 U.S.C. 154(b) by 58 days.

(21) Appl. No.: 14/596,525

(22) Filed: Jan. 14, 2015

(65) Prior Publication Data
US 2015/0214968 A1    Jul. 30, 2015

(30) Foreign Application Priority Data
Jan. 24, 2014  (JP) ................. 2014-010920

(51) Int. Cl.
  *H03B 21/00*  (2006.01)
  *H03L 7/197*  (2006.01)
(52) U.S. Cl.
  CPC ................. *H03L 7/1976* (2013.01)
(58) Field of Classification Search
  CPC . H03L 7/1974; H03L 7/18; H03L 7/16; H03L 7/23; H03B 21/02; G06F 1/025
  USPC ................................ 327/105–107
  See application file for complete search history.

(56) References Cited

U.S. PATENT DOCUMENTS 8,058,942 B2 * 11/2011 Hammond ............ H03L 7/1976
                                                    327/156

FOREIGN PATENT DOCUMENTS

JP    2009-130760    6/2009

* cited by examiner

*Primary Examiner* — Lincoln Donovan
*Assistant Examiner* — Diana J Cheng
(74) *Attorney, Agent, or Firm* — Warner Norcross & Judd LLP

(57) ABSTRACT

The calculator calculates the remainder of the division of which the dividend is the minimum accumulated value at which a carryover occurs in the $\Delta\Sigma$ modulator and the devisor is a fractional set value, and calculates the quotient and remainder of the division of which the dividend is the devisor of the previous division and the devisor is the remainder of the previous division until the remainder becomes zero. The abnormal noise determiner determines that the fractional set value causes periodic abnormal noise based on the quotients calculated by the calculator using the fractional set value. The fractional setter sets in the $\Delta\Sigma$ modulator the fractional set value changed to the extent that the output frequency of the VCO does not exceed a given value when the abnormal noise determiner determines that the changed fractional set value does not cause periodic abnormal noise.

4 Claims, 10 Drawing Sheets

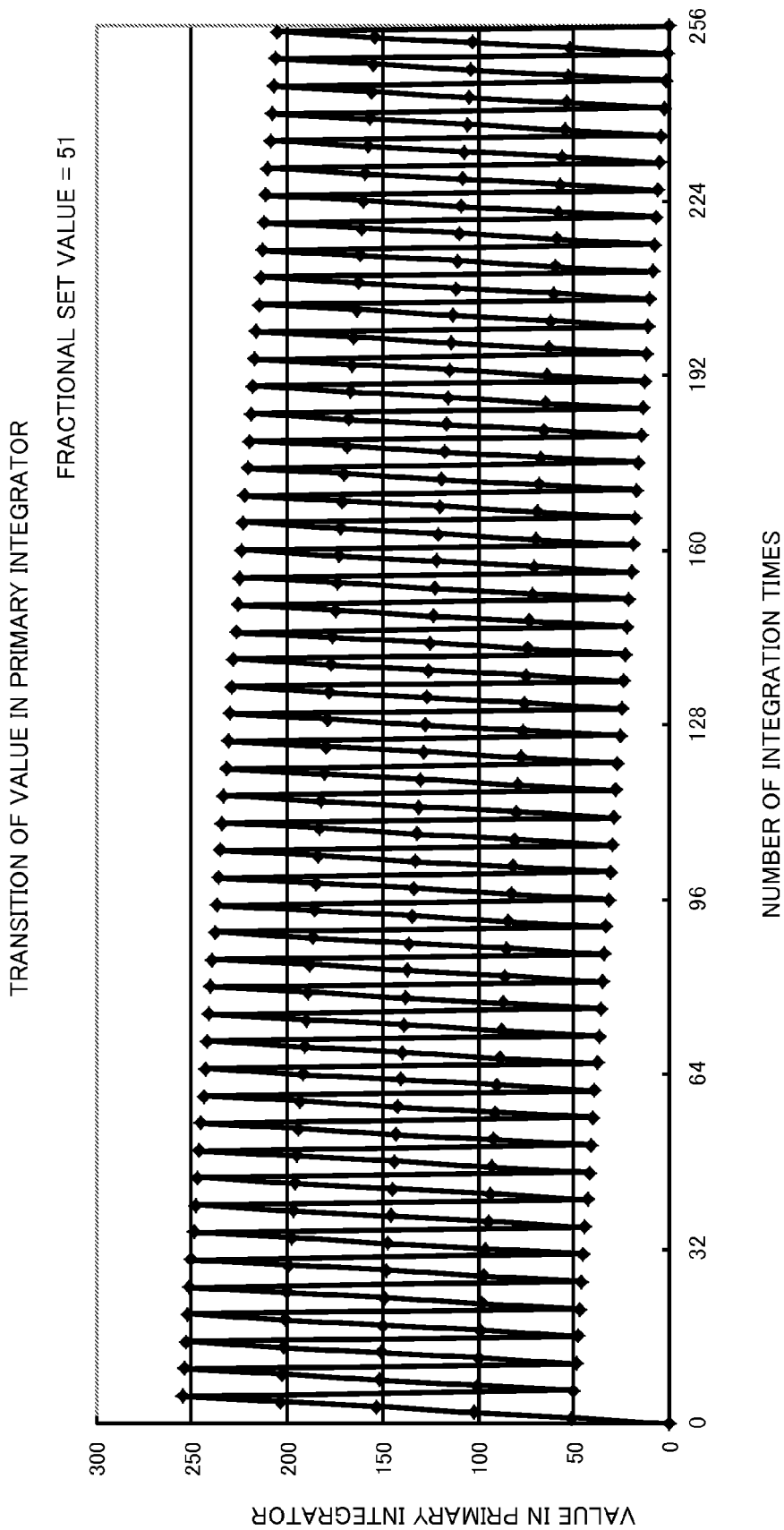

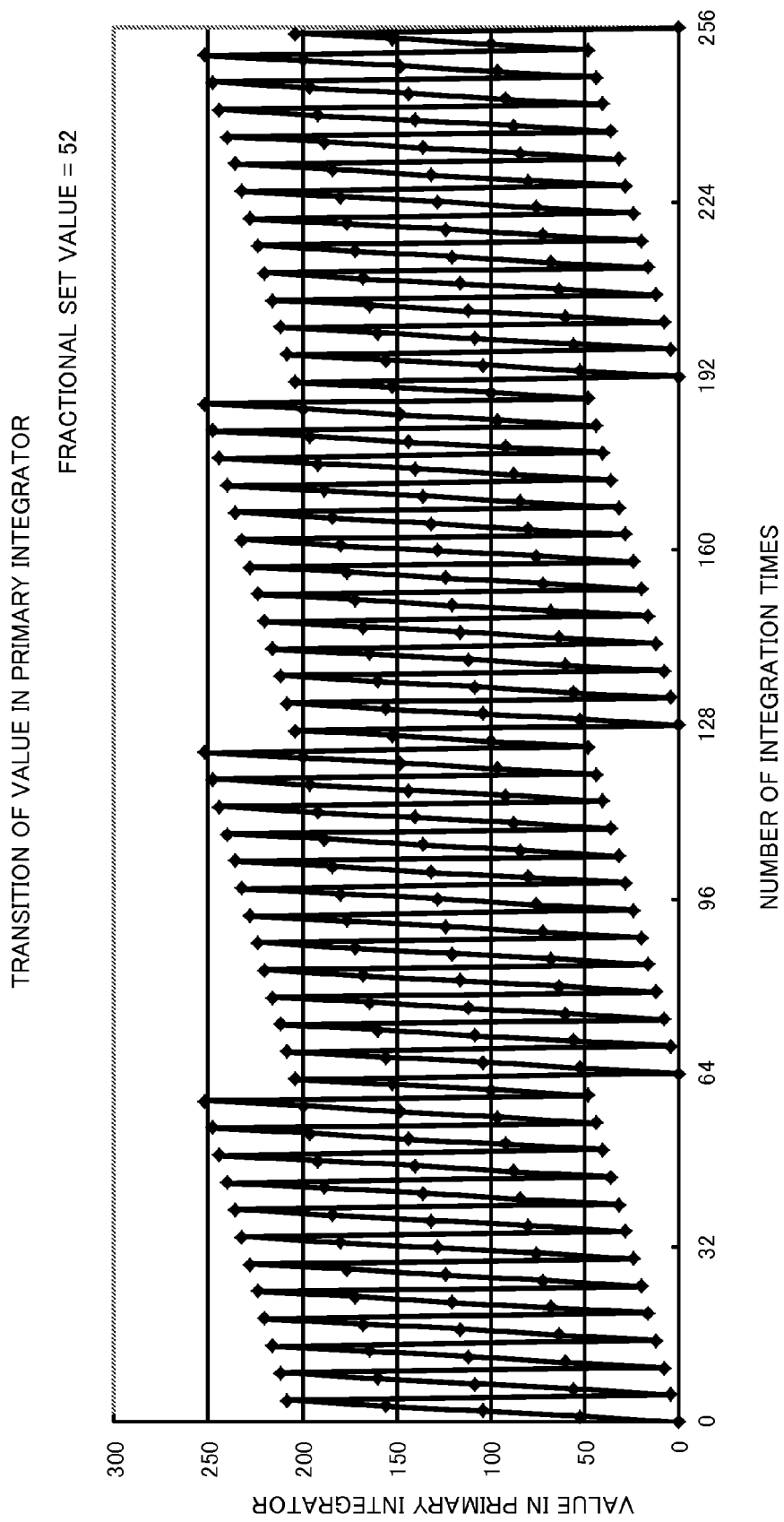

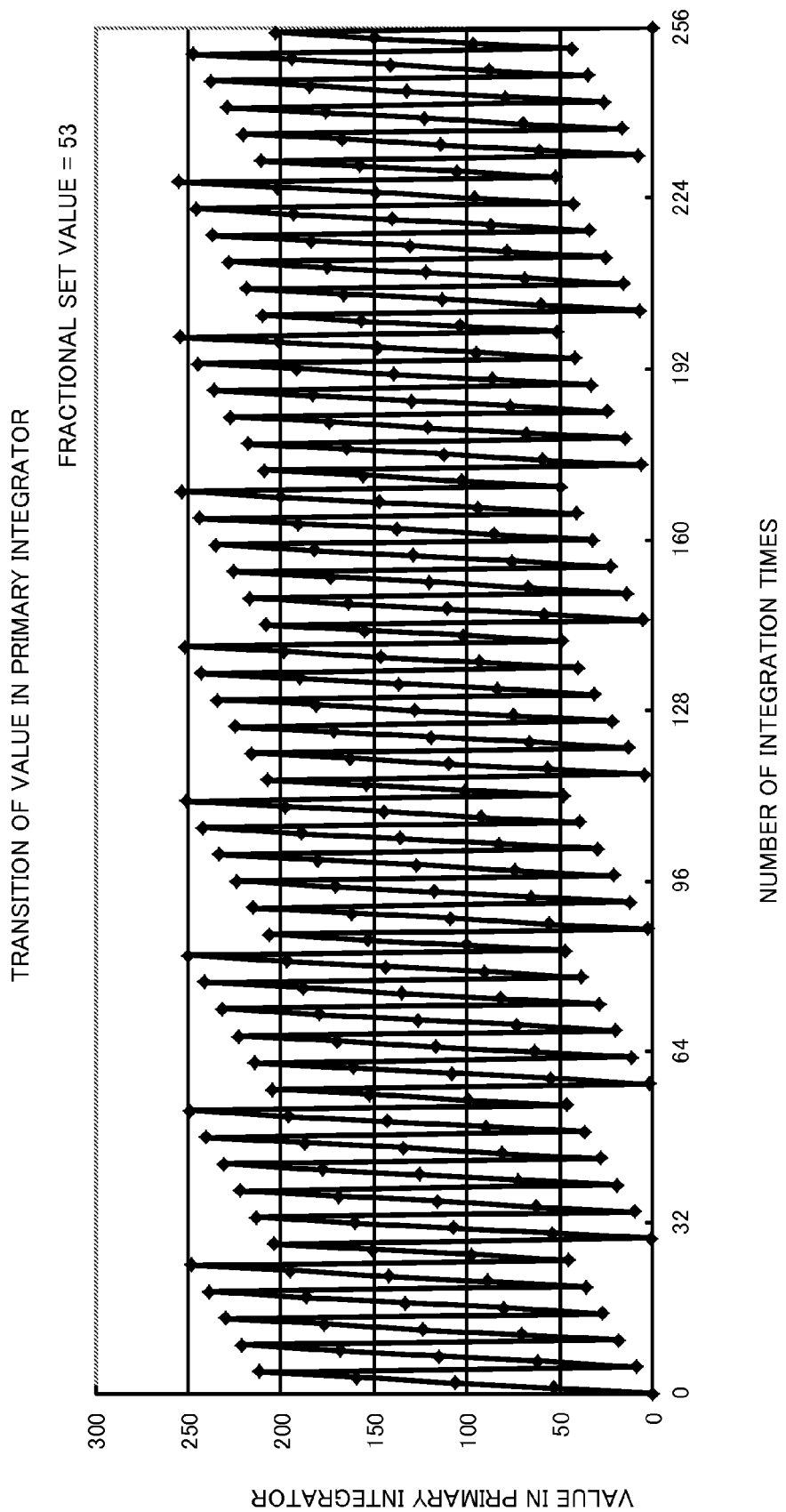

FIG. 3A

FRACTIONAL SET VALUE = 50

| DEVIDEND | DEVISOR | REMAINDER | QUOTIENT |
|---|---|---|---|
| 256 | 50 | 6 |  |
| 50 | 6 | 2 | 8 |
| 6 | 2 | 0 | 3 |

FIG. 3B

FRACTIONAL SET VALUE = 51

| DEVIDEND | DEVISOR | REMAINDER | QUOTIENT |
|---|---|---|---|
| 256 | 51 | 1 |  |
| 51 | 1 | 0 | 51 |

FIG. 3C

FRACTIONAL SET VALUE = 52

| DEVIDEND | DEVISOR | REMAINDER | QUOTIENT |
|---|---|---|---|
| 256 | 52 | 48 |  |
| 52 | 48 | 4 | 1 |
| 48 | 4 | 0 | 12 |

FIG. 3D

FRACTIONAL SET VALUE = 53

| DEVIDEND | DEVISOR | REMAINDER | QUOTIENT |
|---|---|---|---|
| 256 | 53 | 44 |  |
| 53 | 44 | 9 | 1 |
| 44 | 9 | 8 | 4 |
| 9 | 8 | 1 | 1 |
| 8 | 1 | 0 | 8 |

FIG. 5

| FRACTIONAL SET VALUE | PERIODIC ABNORMAL NOISE OCCURRENCE |
|---|---|
| 61681 | ABNORMAL NOISE OCCURS APPROX. EVERY 400 msec |
| 69391 | ABNORMAL NOISE OCCURS APPROX. EVERY 200 msec |
| 100000 | NO AUDIBLE ABNORMAL NOISE OCCURS |
| 157286 | ABNORMAL NOISE OCCURS APPROX. EVERY 200 msec |
| 157287 | ABNORMAL NOISE OCCURS APPROX. EVERY 130 msec |
| 157288 | ABNORMAL NOISE OCCURS APPROX. EVERY 50 msec |
| 199949 | NO AUDIBLE ABNORMAL NOISE OCCURS |
| 200463 | ABNORMAL NOISE OCCURS APPROX. EVERY 400 msec |

FIG. 6

| | FRACTIONAL SET VALUE | | | | | | | | | | | | | |
|---|---|---|---|---|---|---|---|---|---|---|---|---|---|---|
| | 61681 | | 69391 | | 100000 | | 157286 | | 157287 | | 157288 | | 199949 | | 200463 | |
| STAGE | NUMBER OF OCCURRENCES | FLUCTUATION RATE | NUMBER OF OCCURRENCES | FLUCTUATION RATE | NUMBER OF OCCURRENCES | FLUCTUATION RATE | NUMBER OF OCCURRENCES | FLUCTUATION RATE | NUMBER OF OCCURRENCES | FLUCTUATION RATE | NUMBER OF OCCURRENCES | FLUCTUATION RATE | NUMBER OF OCCURRENCES | FLUCTUATION RATE | NUMBER OF OCCURRENCES | FLUCTUATION RATE |
| 1 | 15420 | | 53971 | | 62144 | | 104858 | | 104857 | | 104856 | | 62195 | | 61681 | |
| 2 | 1 | 15420 | 15420 | 3 | 37856 | 1 | 52428 | 2 | 52430 | 1 | 52432 | 1 | 13364 | 4 | 15420 | 4 |
| 3 | 0 | | 7711 | 1 | 24288 | 1 | 2 | 26214 | 52427 | 1 | 52424 | 1 | 8739 | 1 | 1 | 15420 |
| 4 | | | 7709 | 1 | 13568 | 1 | 0 | | 3 | 17475 | 8 | 6553 | 4625 | 1 | 0 | |
| 5 | | | 2 | 3854 | 10720 | 1 | | | 2 | | 0 | | 4114 | 1 | | |
| 6 | | | 1 | 2 | 2848 | 3 | | | 1 | | 2 | | 511 | 8 | | |
| 7 | | | 0 | | 2176 | 1 | | | 0 | | | | 26 | 19 | | |
| 8 | | | | | 672 | 3 | | | | | | | 17 | 1 | | |
| 9 | | | | | 160 | 4 | | | | | | | 9 | 1 | | |
| 10 | | | | | 32 | 5 | | | | | | | 8 | 1 | | |
| 11 | | | | | 0 | | | | | | | | 1 | 8 | | |
| 12 | | | | | | | | | | | | | 0 | | | |

FIG. 7A

FRACTIONAL SET VALUE = 69391

| DEVIDEND | DEVISOR | REMAINDER | QUOTIENT |
|---|---|---|---|
| 262144 | 69391 | 53971 | |
| 69391 | 53971 | 15420 | 1 |
| 53971 | 15420 | 7711 | 3 |
| 15420 | 7711 | 7709 | 1 |
| 7711 | 7709 | 2 | 1 |
| 7709 | 2 | 1 | 3854 |
| 2 | 1 | 0 | 2 |

FIG. 7B

FRACTIONAL SET VALUE = 69392

| DEVIDEND | DEVISOR | REMAINDER | QUOTIENT |
|---|---|---|---|
| 262144 | 69392 | 53968 | |
| 69392 | 53968 | 15424 | 1 |
| 53968 | 15424 | 7696 | 3 |
| 15424 | 7696 | 32 | 2 |
| 7696 | 32 | 16 | 240 |
| 32 | 16 | 0 | 2 |

FIG. 7C

FRACTIONAL SET VALUE = 69390

| DEVIDEND | DEVISOR | REMAINDER | QUOTIENT |
|---|---|---|---|
| 262144 | 69390 | 53974 | |
| 69390 | 53974 | 15416 | 1 |
| 53974 | 15416 | 7726 | 3 |
| 15416 | 7726 | 7690 | 1 |
| 7726 | 7690 | 36 | 1 |
| 7690 | 36 | 22 | 213 |
| 36 | 22 | 14 | 1 |
| 22 | 14 | 8 | 1 |
| 14 | 8 | 6 | 1 |
| 8 | 6 | 2 | 1 |
| 6 | 2 | 0 | 3 |

FRACTIONAL N FREQUENCY SYNTHESIZER AND SETTING METHOD THEREOF

CROSS-REFERENCE TO RELATED APPLICATION

This application claims the benefit of Japanese Patent Application No. 2014-010920, filed on Jan. 24, 2014, the entire disclosure of which is incorporated by reference herein.

FIELD

This application relates generally to a fractional N frequency synthesizer, and more particularly, to a method of setting a fractional set value in a ΔΣ modulator of a fractional N frequency synthesizer.

BACKGROUND

A frequency synthesizer adopts a technique that enables the use of a decimal fraction in setting a frequency when the frequency is not an integer multiple of a value resulting from dividing a reference frequency for setting the frequency by an integer. The most typical technique is a fractional N frequency synthesizer. As disclosed in, for example, Unexamined Japanese Patent Application Kokai Publication No. 2009-130760, this technique is utilized to increase the frequency resolution of the digital portion, thereby enabling fine decimal fraction frequency division setting.

A fractional N frequency synthesizer includes a reference frequency oscillator, a phase frequency comparator (PFC), a charge pump (CP), a loop filter, a voltage controlled oscillator (VCO), a multi-modulus frequency divider, and a ΔΣ modulator.

The phase frequency comparator compares the reference frequency output from the reference frequency oscillator with the phase frequency of an input signal and outputs the difference between the reference frequency and the phase frequency. A pulse signal output from the CP in accordance with the output of the phase frequency comparator is smoothed by the loop filter and serves as the control voltage for the VCO. This control voltage controls the oscillating frequency of the VCO. The VCO outputs a clock signal having a frequency proportional to the control voltage.

The ΔΣ modulator accumulates the fractional set value at each reference frequency cycle, and generates a carryover signal when the accumulated value exceeds the maximum value of an accumulator in the ΔΣ modulator. The multi-modulus frequency divider divides the frequency of the clock signal from the VCO by a different frequency division value depending on whether the carryover signal is generated by the ΔΣ modulator at each reference frequency cycle, and uses the clock signal with the divided frequency as the input signal to the phase frequency comparator.

With the fractional set value of the ΔΣ modulator being changed, the fractional N frequency synthesizer can generate not only a frequency that is an integer multiple of the value resulting from dividing the reference frequency by an integer but also generate a frequency that is a decimal fraction multiple of the value. In such a case, the operation cycle of the ΔΣ modulator (the timing for performing iterative accumulation) is equal in length to the cycle of division by N or division by N+1 executed by the multi-modulus frequency divider.

SUMMARY

The fractional N frequency synthesizer according to a first exemplary aspect of the present disclosure includes:

a phase frequency comparator comparing a reference frequency with the phase frequency of an input signal and outputting the difference between the reference frequency and the phase frequency;

a voltage controlled oscillator outputting a clock signal in response to the output of the phase frequency comparator;

a ΔΣ modulator accumulating a fractional set value at each cycle of the reference frequency and generating a carryover signal when the accumulated value exceeds the maximum value of an accumulator in the ΔΣ modulator;

a frequency divider dividing the frequency of the clock signal from the voltage controlled oscillator by a different frequency division value depending on whether the carryover signal has been generated by the ΔΣ modulator at each cycle of the reference frequency, and using the clock signal with the divided frequency as the input signal to the phase frequency comparator;

a calculator calculating the remainder of the division of which the dividend is the minimum accumulated value at which a carryover occurs in the ΔΣ modulator and the devisor is the fractional set value, and if the remainder is not zero, repeatedly calculating the quotient and remainder of the division of which the dividend is the devisor of the previous division and the devisor is the value of the remainder obtained in the previous division until the value of the remainder becomes zero;

an abnormal noise determiner determining, after the calculator has calculated the quotient and remainder of the division using a fractional set value to be set in the ΔΣ modulator until the remainder has become zero, that the fractional set value causes periodic abnormal noise when the calculated quotients include a value exceeding a threshold and determining that the factional set value does not cause periodic abnormal noise when the calculated quotients do not include a value exceeding the threshold; and a fractional setter changing the fractional set value to the extent that the frequency of the clock signal eventually obtained by the voltage controlled oscillator does not exceed a given value when the abnormal noise determiner has determined that periodic abnormal noise has occurred, and setting the changed fractional set value as the fractional set value of the ΔΣ modulator when the abnormal noise determiner has determined that the changed fractional set value has not caused periodic abnormal noise.

Preferably, the fractional setter incrementally increases or decreases the fractional set value by one when the abnormal noise determiner has determined that periodic abnormal noise has occurred, the abnormal noise determiner continues to determine whether periodic abnormal noise occurs, and the fractional set value is set as the fractional set value of the ΔΣ modulator when it has been determined that no periodic abnormal noise has occurred.

The fractional N frequency synthesizer setting method according to a second exemplary aspect of the present disclosure is a fractional N frequency synthesizer setting method executed by a fractional N frequency synthesizer including:

a phase frequency comparator comparing a reference frequency with the phase frequency of an input signal and outputting the difference between the reference frequency and the phase frequency;

a voltage controlled oscillator outputting a clock signal in response to the output of the phase frequency comparator;

a ΔΣ modulator accumulating a fractional set value at each cycle of the reference frequency and generating a carryover signal when the accumulated value exceeds the maximum value of an accumulator in the ΔΣ modulator; and a frequency divider dividing the frequency of the clock signal from the voltage controlled oscillator by a different frequency division value depending on whether the carryover signal has been generated by the ΔΣ modulator at each cycle of the reference frequency, and using the clock signal with the divided frequency as the input signal to the phase frequency comparator, wherein the method includes:

a calculation step of calculating the remainder of the division of which the dividend is the minimum accumulated value at which a carryover occurs in the ΔΣ modulator and the devisor is the fractional set value, and if the remainder is not zero, repeatedly calculating the quotient and remainder of the division of which the dividend is the devisor of the previous division and the devisor is the value of the remainder obtained in the previous division until the value of the remainder becomes zero;

an abnormal noise determination step of determining, after the quotient and remainder of the division have been calculated using a fractional set value to be set in the ΔΣ modulator until the remainder has become zero in the calculation step, that the fractional set value causes periodic abnormal noise when the calculated quotients include a value exceeding a threshold, and determining that the factional set value does not cause periodic abnormal noise when the calculated quotients do not include a value exceeding the threshold; and a fractional setting step of changing the fractional set value to the extent that the frequency of the clock signal eventually obtained by the voltage controlled oscillator does not exceed a given value when it has been determined in the abnormal noise determination step that periodic abnormal noise has occurred, and setting the changed fractional set value as the fractional set value of the ΔΣ modulator when it has been determined in the abnormal noise determination step that the changed fractional set value has not caused periodic abnormal noise.

Preferably, in the fractional setting step, the fractional set value is incrementally increased or decreased by one when it has been determined in the abnormal noise determination step that periodic abnormal noise has occurred, it is continued to determine in the abnormal noise determination step whether periodic abnormal noise occurs, and the fractional set value is set as the fractional set value of the ΔΣ modulator when it has been determined that no periodic abnormal noise has occurred.

The present disclosure can prevent periodic abnormal noise that occurs due to the relationship between the accumulated value causing a carryover and the fractional set value in a fractional N frequency synthesizer.

BRIEF DESCRIPTION OF THE DRAWINGS

A more complete understanding of this application can be obtained when the following detailed description is considered in conjunction with the following drawings, in which:

FIG. 2B is a chart showing an exemplary fractional set value and carryover occurrence cycle variation;

FIG. 2C is a chart showing an exemplary fractional set value and carryover occurrence cycle variation;

FIG. 2D is a chart showing an exemplary fractional set value and carryover occurrence cycle variation;

FIG. 3A is a chart showing exemplary fluctuation rates;

FIG. 3B is a chart showing an exemplary fluctuation rate;

FIG. 3C is a chart showing exemplary fluctuation rates;

FIG. 3D is a chart showing exemplary fluctuation rates;

FIG. 5 is a chart showing exemplary situations where abnormal noise occurs.

FIG. 6 is a chart showing the number of occurrences of periodic fluctuation and the fluctuation rate with the fractional set values in FIG. 5;

FIG. 7A is a chart showing an exemplary fractional set value preventing periodic abnormal noise;

FIG. 7B is a chart showing an exemplary fractional set value preventing periodic abnormal noise; and FIG. 7C is a chart showing an exemplary fractional set value preventing periodic abnormal noise.

DETAILED DESCRIPTION

A fractional N frequency synthesizer has the following problems. When the accumulated value in the ΔΣ modulator that causes a carryover is not an integer multiple of the fractional set value, the reminder in the integrator when a carryover occurs changes each time a carryover occurs. Therefore, the interval between numbers of integrations in which carryovers occur varies. Consequently, the cycle of the frequency division value of the multi-modulus frequency divider varies.

Periodic fluctuation in the frequency division value of the multi-modulus frequency divider causes the VCO (voltage controlled oscillator) control voltage to vary and consequently the VCO output frequency to fluctuate according to the fluctuation cycle of VCO control voltage. This fluctuation modulates the VCO output frequency, whereby periodic abnormal noise due to the modulated constituents may appear in the sound reproduced at the reception end in the communication using the VCO output frequency as the carrier wave.

The present disclosure is made with the view of the above situation and an objective of the present disclosure is to prevent periodic abnormal noise that occurs due to the relationship between the accumulated value causing a carryover and the fractional set value in a fractional N frequency synthesizer.

Figure 1:
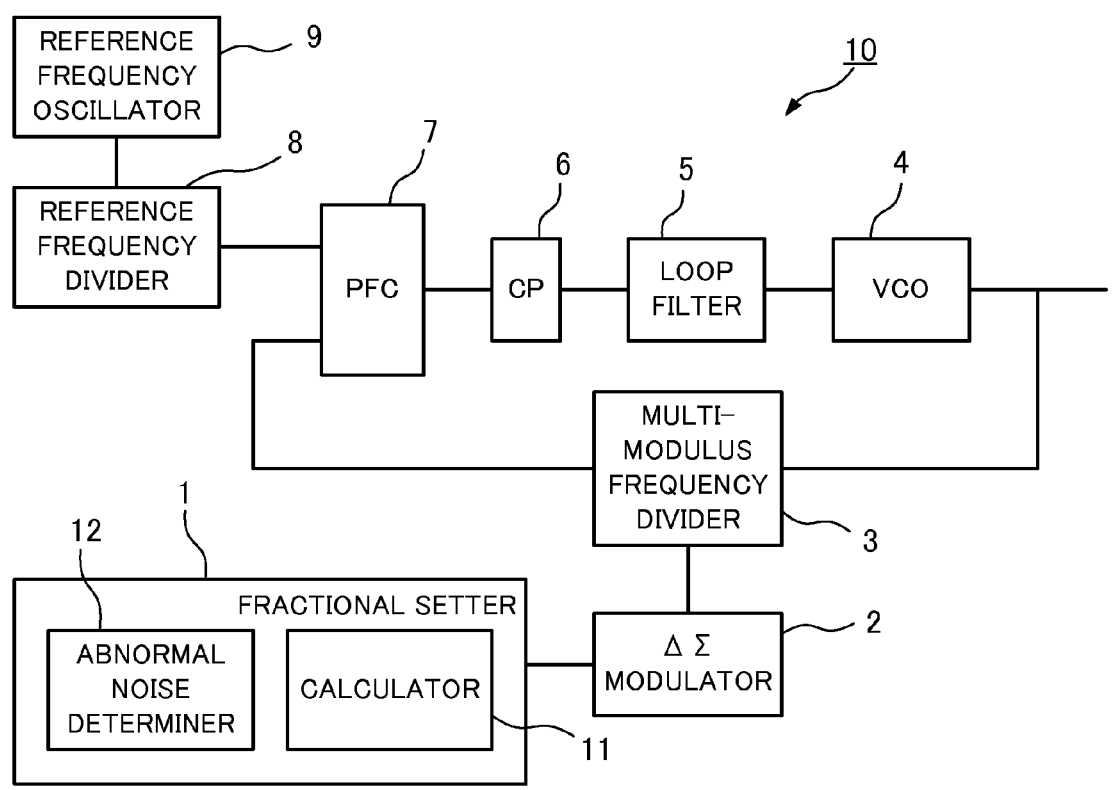
FIG. 1 is a block diagram showing an exemplary configuration of the fractional N frequency synthesizer according to an embodiment of the present disclosure.

FIG. 1 is a block diagram showing an exemplary configuration of the fractional N frequency synthesizer according to an embodiment of the present disclosure. A fractional N frequency synthesizer (hereinafter referred to as ΔΣPLL (phase locked loop)) 10 includes a reference frequency oscillator 9, a reference frequency divider 8, a phase frequency comparator (PFC) 7, a charge pump (CP) 6, a loop filter 5, a voltage controlled oscillator (VCO) 4, a multi-modulus frequency divider 3, and a ΔΣ modulator 2. The ΔΣPLL 10 includes a fractional setter 1. The fractional setter 1 includes a calculator 11 and an abnormal noise determiner 12.

The reference frequency divider 8 divides the frequency of the output of the reference frequency oscillator 9 by a reference frequency division value and outputs a pulse signal of a reference frequency. The PFC 7 compares the pulse signal of the reference frequency (the output of the reference frequency divider 8) with a pulse signal generated by dividing the output frequency of the VCO 4 (the output of the multi-modulus frequency divider 3), and generates a control signal corresponding to the frequency difference between the two pulses (the output of the PFC 7).

The CP 6 converts the control signal output from the preceding PFC 7 to a voltage/current level at which the VCO 4 can be driven, and enters the control signal into the loop filter 5. The output of the CP 6 has a positive pulse signal and a negative pulse signal with respect to the reference voltage. The pulse signals are generated in accordance with the fluctuation in the output frequency of the VCO 4. The loop filter 5 plays a role as an integrator and smooths the pulse-shaped signal output from the CP 6.

The VCO 4 receives a control voltage output from the loop filter 5 that is the pulse-shaped signal output from the CP 6 and smoothed by the loop filter 5. This control voltage controls the oscillating frequency of the VCO 4.

The output frequency of the VCO 4 is divided by the multi-modulus frequency divider 3. The multi-modulus frequency divider 3 divides the frequency based on the frequency division setting output from the ΔΣ modulator 2. The ΔΣ modulator 2 periodically increases/decreases the frequency division setting based on a preset fractional set value. The ΔΣ modulator 2 includes, in addition to a primary integrator integrating the fractional set value as a fixed value, a secondary integrator integrating the output of the primary integrator, and a higher-order integrator further integrating the output of the secondary integrator. Periodic abnormal noise is caused by the primary integrator, and the output of the second and subsequent higher-order integrators does not directly contribute to the periodic abnormal noise.

The primary integrator successively accumulates (integrates) the fractional set value on a reference frequency basis. The accumulator of the primary integrator is finite in size and outputs a carryover signal when the accumulated value exceeds the finite value. The frequency division setting of the multi-modulus frequency divider 3 is controlled based on this carryover signal.

The multi-modulus frequency divider 3 divides the frequency of the clock signal from the VCO 4 by a different frequency division value depending on whether a carryover signal is generated by the ΔΣ modulator 2 at each reference frequency cycle. For example, the frequency division setting of the multi-modulus frequency divider 3 is N or N+1: N+1 when a carryover occurs and N when no carryover occurs. In such a case, the operation cycle of the primary integrator (the timing for performing iterative accumulation) is equal in length to the cycle of division by N or division by N+1 executed by the multi-modulus frequency divider 3. Incidentally, as for the carryover signals of the second and subsequent higher-order integrator, division by N+M and division by N−M are occurred at shifted times and therefore cancelled and do not contribute to the periodic abnormal noise.

The fractional setter 1 calculates a fractional set value preventing the periodic abnormal noise from the fractional set value determined according to the frequency for the ΔΣPLL 10 to output and sets the value in the ΔΣ modulator 2. How the periodic abnormal noise occurs will be described hereafter.

FIGS. 2A to 2D are charts showing exemplary fractional set values and carryover occurrence cycle variations. Here, for easier understanding of the mechanism of occurrence of periodic abnormal noise, the value (accumulated value) causing a carryover in ΔΣ modulator 2 is $2^8=256$. The accumulator of the primary integrator of the ΔΣ modulator 2 has eight bits. The accumulator (primary integrator) can have values 0 to $2^8-1=255$. In this case, regardless of the fractional set value, the primary integrator completes a round of integrations and returns to the initial state after integrating the fractional set value 256 times.

Figure 2A:
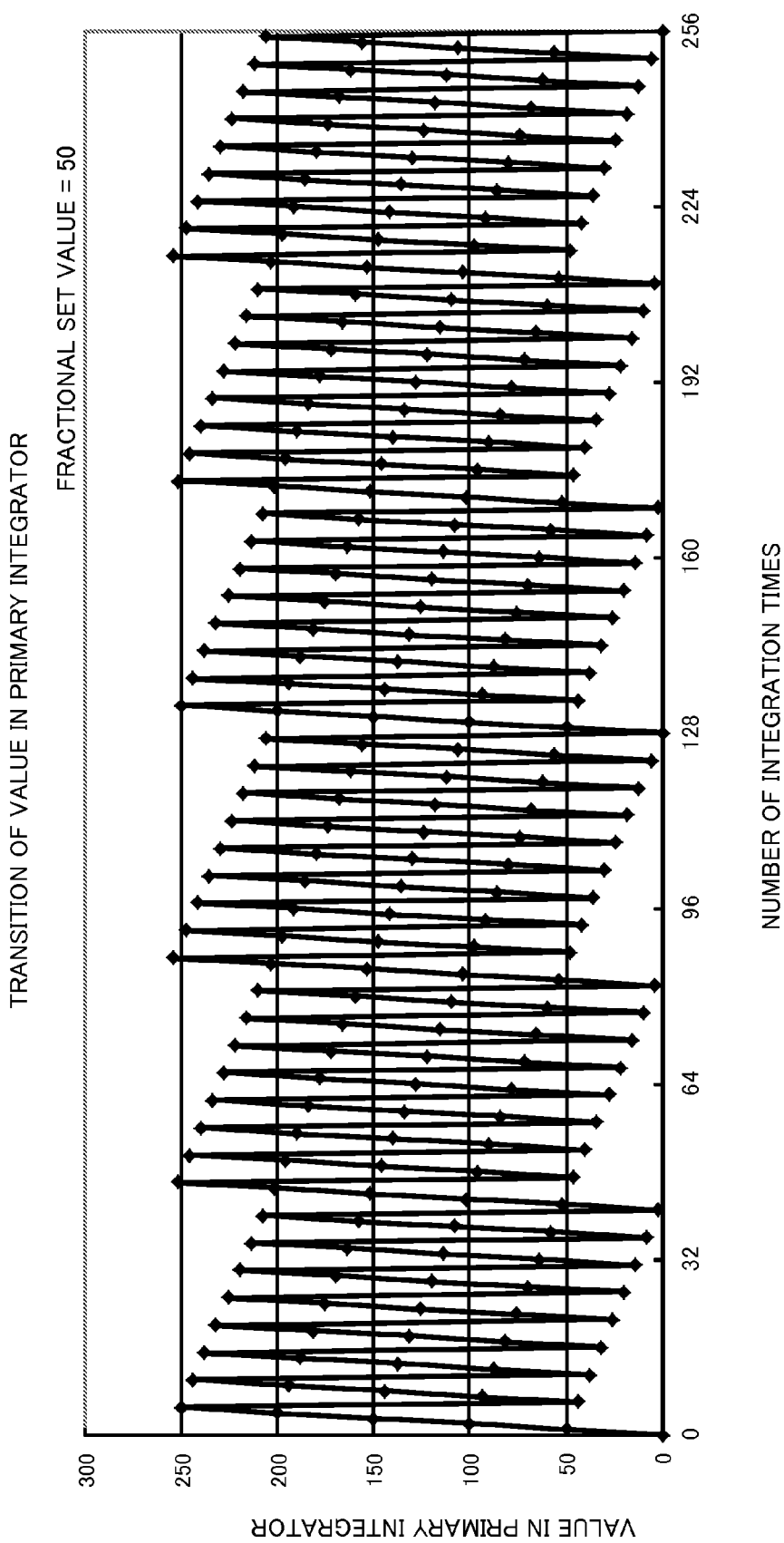
FIG. 2A is a chart showing an exemplary fractional set value and carryover occurrence cycle variation.

FIG. 2A shows the case in which the fractional set value is 50. The primary integrator of the ΔΣ modulator 2 adds (integrates) the fractional set value to the accumulator at each reference frequency cycle. FIG. 2A presents how the numerical value in the accumulator changes during each integration provided that the initial value of the accumulator is zero. For example, 50 is added at each of the first five integrations and during the sixth integration, a carryover occurs and the remainder is 44. The local minimum points in the transition of value in the primary integrator indicate the number of integration times in which a carryover occurs and the remainder in the accumulator. A short-cycle envelope that fluctuates six times while the primary integrator completes a round of integrations (256 integrations) is obtained by connecting the local minimum points in which a carryover occurs. The interval between a local minimum and the subsequent local minimum of the envelope is termed the cycle of the envelope.

Furthermore, a long-cycle envelope that fluctuates twice while the primary integrator completes a round of integrations (256 integrations) is obtained by connecting the local minimum points of the short-cycle envelope. When the fractional set value is 50, the primary integrator completes a round of integrations and the value in the accumulator returns to zero after 128 integrations.

In more detailed operation of the primary integrator, a carryover occurs during the sixth integration at the beginning of each cycle of the short-cycle envelope and a carryover occurs during the fifth integration in the rest of the short-cycle envelope. Consequently, the multi-modulus frequency divider 3 has the frequency division value upon occurrence of a carryover set at longer intervals only when a carryover occurs during the sixth integration. This variation is a contributory factor of the periodic abnormal noise.

Furthermore, it is understood from a closer look at the envelope that fluctuates six times with a short-cycle that a carryover occurs eight times in the first and second cycles from the left and a carryover occurs nine times in the third cycle. In other words, a carryover during the sixth integration occurs at an interval of eight times in the first and second cycles while it occurs at an interval of nine times in the third cycle. The long-cycle envelope presents this variation. This variation is also a contributory factor of the periodic abnormal noise.

FIG. 2B shows the case in which the fractional set value is 51. In FIG. 2B, an envelope that fluctuates once while the primary integrator completes a round of integrations (256 integrations) appears. In this case, only one kind of envelope appears. Also in this case, a carryover occurs during the sixth integration at the beginning of the envelope. A carryover occurs during the fifth integration in the rest of the envelope. This variation is a contributory factor of the periodic abnormal noise.

FIG. 2C shows the case in which the fractional set value is 52. In FIG. 2C, a short-cycle envelope that fluctuates four times while the primary integrator completes a round of integrations (256 integrations) appears. When the fractional set value is 52, the primary integrator completes a round of integrations and the value in the accumulator returns to zero after 64 integrations. No long-cycle envelope appears in FIG. 2C.

The short-cycle envelope in FIG. 2A and envelope in FIG. 2B first ascend largely and then descend diagonally to the right. In FIG. 2C, unlike the first two cases, the envelope ascends diagonally to the right and descends largely at the end. In other words, when the fractional set value is 52, a carryover occurs during the fourth integration at the end of each cycle of the envelope (the integrations 64, 128, 192, and 256) and a carryover occurs during the fifth integration in the rest of the envelope. Consequently, the multi-modulus frequency divider 3 has the frequency division value upon occurrence of a carryover set at shorter intervals only when a carryover occurs during the fourth integration. This variation is a contributory factor of the periodic abnormal noise.

FIG. 2D shows the case in which the fractional set value is 53. In FIG. 2D, a short-cycle envelope that fluctuates nine times while the primary integrator completes a round of integrations (256 integrations) appears. Furthermore, a long-cycle envelope that fluctuates once while the primary integrator completes a round of integrations (256 integrations) is obtained by connecting the local minimum points of the short-cycle envelope. Both the short-cycle envelope and long-cycle envelope of the envelope in FIG. 2D ascend diagonally to the right and descend largely at the end. In other words, a carryover occurs during the fourth integration at the end of each cycle of the short-cycle envelope. Furthermore, a carryover occurs five times in the last cycle of the short-cycle envelope while it occurs six times in the rest of the short-cycle envelope. These variations are contributory factors of the periodic abnormal noise.

How the periodic abnormal noise occurs is described above. However, when the fractional set value is not a submultiple of the value causing a carryover, the above-described variations certainly occur. If only the submultiple of the value is used for preventing the variations, frequencies that are decimal fraction multiples of the value resulting from dividing the reference frequency by an integer cannot be set. Thus, it is suggested to assess the magnitude of abnormal noise that occurs due to the variation and select a fractional set value causing less abnormal noise.

Here, the remainder of the division of which the dividend is a value at which a carryover occurs (the minimum accumulated value=the maximum value of the accumulator +1) and the divisor is a fractional set value is calculated. If the remainder is zero, the fractional set value is a submultiple of the value at which a carryover occurs and therefore no variation occurs. Here, if the remainder is not zero, the quotient and remainder of the division of which the dividend is the divisor of the previous division (the fractional set value in this case) and the divisor is the value of the remainder obtained in the previous division are calculated. If this remainder is not zero, the quotient and remainder of the division of which the dividend is the divisor of the previous division and the devisor is the value of the remainder obtained in the previous division are further calculated. This process is repeated until the value of the remainder becomes zero.

The remainder of each division indicates the number of fluctuations of the envelope including the local minimum points where a carryover occurs in the transition of value in the primary integrator. The inventor of the present disclosure found that the quotient of the above-described division presents the magnitude of fluctuation with respect to the remainder of the previous division (=the number of fluctuations of the envelope), which is the dividend of the division, and is correlated to the magnitude of periodic abnormal noise. The quotient of the above-described division is defined as the fluctuation rate of the remainder of the previous division (=the number of fluctuations of the envelope), which is the dividend of that division.

FIGS. 3A to 3D are charts showing exemplary fluctuation rates. FIGS. 3A, 3B, 3C, and 3D correspond to FIGS. 2A, 2B, 2C, and 2D, respectively. In FIGS. 3A to 3D, the top left dividend is the minimum accumulated value $2^8=256$ at which a carryover occurs. The devisor in the topmost row except for the title row is the fractional set value. In the second row, the dividend of the division is the divisor of the first division (the fractional set value) and the divisor is the remainder of the first division. In the third and subsequent rows, the dividend is the devisor in the row above (previous division) and the devisor is the remainder in the row above. The quotient of each division is given in the row of the division. The quotient is the fluctuation rate of the number of fluctuations indicated by the remainder in the row above.

FIG. 3A shows the case in which the fractional set value is 50. The first remainder 6 corresponds to the number of fluctuations of the short-cycle envelope in FIG. 2A. The remainder 2 of the division in the second row corresponds to the number of fluctuations of the long-cycle envelope. The quotient 8 (=50/6) of the division in the second row is the fluctuation rate with respect to the number of fluctuations of the envelope indicated by the remainder 6 of the first division. Here, the quotient can be obtained to the decimal point and beyond. However, the periodic abnormal noise can roughly be assessed by the number of digits (dB). Therefore, practically, the integer portion is sufficient.

FIG. 3B shows the case in which the fractional set value is 51. The first remainder 1 corresponds to the envelope in FIG. 2B fluctuating one time. The fluctuation rate corresponding to the number of fluctuations of the envelope (the remainder), 1, is 51.

FIG. 3C shows the case in which the fractional set value is 52. Here, the envelope ascends diagonally to the right. The remainder 4 of the division in the second row corresponds to the number of fluctuations of the envelope in FIG. 2C. The fluctuation rate corresponding to the number of fluctuations of the envelope (the remainder), 4, is 12. Incidentally, the first remainder 48 presents the number of times the remainder obtained upon an occurrence of a carryover increases from the previous remainder obtained upon the previous occurrence of a carryover while the primary integrator completes a round of integrations.

FIG. 3D shows the case in which the fractional set value is 53. Here also, the envelope ascends diagonally to the right. The remainder 9 of the division in the second row corresponds to the number of fluctuations of the short-cycle envelope in FIG. 2D. The remainder 1 of the division in the fourth row corresponds to the number of fluctuations of the long-cycle envelope. The fluctuation rate corresponding to the number of fluctuations of the short-cycle envelope (the remainder), 9, is 4, and the fluctuation rate corresponding to the number of fluctuations of the long-cycle envelope (the remainder), 1, is 8. In other words, the magnitude of the fluctuation in which the number of carryovers is reduced to five in the long-cycle envelope (the quotient 8) is assessed as double the magnitude of the fluctuation in which a carryover occurs in a smaller number, 4, of integrations in the short-cycle envelope (the quotient 4).

The relationship between the remainder and envelope can be generalized as follows. The first remainder presents the number of times the remainder obtained upon an occurrence of a carryover increases from the previous remainder obtained upon the previous occurrence of a carryover while the primary integrator completes a round of integrations. The next remainder presents the number of times (the number of points), among the points where the remainder obtained upon the occurrence of the carryover increases from the previous remainder obtained upon the previous occurrence of the carryover, the remainder at a point decreases from the remainder at the previous point. From then on, the remainder presents in an alternating manner between increase and decrease of the number of points where the remainder decreases or increases from the previous point among the target points to increase or decrease. The increase and decrease appears alternately until the remainder becomes zero.

For example, when the fractional set value is 53 (FIGS. 2D and 3D), the first remainder 44 is the number of times the remainder obtained upon an occurrence of a carryover increases from the previous remainder obtained upon the previous occurrence of a carryover. The second remainder 9 is the number of points, among the 44 points where the remainder obtained upon an occurrence of a carryover increases from the previous remainder obtained upon the previous occurrence of a carryover, the remainder at a point decreases from the remainder at the previous point. The third remainder 8 is the number of points, among the 9 points where the remainder at a point decreases from the remainder at the previous point, the remainder at a point increases from the remainder at the previous point. Then, the fourth remainder 1 is the number of points, among the 8 points where the remainder at a point increases from the remainder at the previous point, the remainder at a point decreases from the remainder at the previous point.

It can be determined whether a fractional set value causes periodic abnormal noise using the maximum value of the fluctuation rates (quotients) for the fractional set value. For example, if the maximum value of the obtained quotients is equal to or greater than a threshold, the fractional set value is determined to cause periodic-audibly-significant abnormal noise. If the maximum value of the obtained quotients is less than a threshold, the fractional set value is determined not to cause periodic-audibly-significant abnormal noise.

The calculator 11 in FIG. 1 calculates the remainder of the division of which the dividend is the minimum accumulated value at which a carryover occurs in the ΔΣ modulator 2 and the divisor is the fractional set value. If the remainder is not zero, the calculator 11 repeatedly calculates the quotient (fluctuation rate) and remainder of the division of which the dividend is the divisor of the previous division and the divisor is the value of the remainder obtained in the previous division until the value of the remainder becomes zero. The abnormal noise determiner 12 compares the maximum value of the fluctuation rates calculated from the fractional set value determined according to the frequency for the ΔΣPLL 10 to output with a threshold, and determines whether the fractional set value causes periodic abnormal noise.

If it is determined that periodic abnormal noise occurs, the fractional setter 1 increases or decreases the fractional set value within an acceptable range of the frequency for the ΔΣPLL 10 to output and seeks for a fractional set value with which it is determined that periodic abnormal noise does not occur. For example, a factional set value enabling output of a frequency closest to the frequency for the ΔΣPLL 10 to output among the fractional set values that are within an acceptable range of the frequency for the ΔΣPLL 10 to output and with which the maximum value of the fluctuation rates is less than a threshold is selected.

If the four fractional set values in FIGS. 3A to 3D fall within the acceptable range, for example, assuming that the fluctuation rate threshold is 10, among the fractional set values in FIGS. 3A to 3D, the values 51 and 52 are determined to cause periodic abnormal noise and the values 50 and 53 are determined not to cause periodic abnormal noise. Then, when the fractional set value for the frequency for the ΔΣPLL 10 to output is 51, the fractional setter 1 selects the fractional set value 50. When the fractional set value for the frequency for the ΔΣPLL 10 to output is 52, the fractional setter 1 selects the fractional set value 53.

The fractional set value enabling output of a frequency closest to the frequency for the ΔΣPLL 10 to output among the fractional set values with which the maximum value of the fluctuation rates is less than a threshold can be determined as follows. If the initial fractional set value is determined to cause periodic abnormal noise, the fractional set value is increased by one to obtain a first fractional set value. If the first fractional set value is determined to cause periodic abnormal noise, then, the initial fractional set value is decreased by one to obtain a second fractional set value. The second fractional set value can be determined before the first fractional set value. From then on, by alternately increasing by one the fractional set value that has already been increased by one for the previous-previous time and decreasing by one the fractional set value that has already been decreased by one for the previous-previous time, the maximum value of the fluctuation rates is calculated until a fractional set value with which the maximum value of the fluctuation rates is less than a threshold is found. Then, the fractional set value that is first determined not to cause periodic abnormal noise is selected as the fractional set value to set in the ΔΣ modulator 2.

Figure 4:
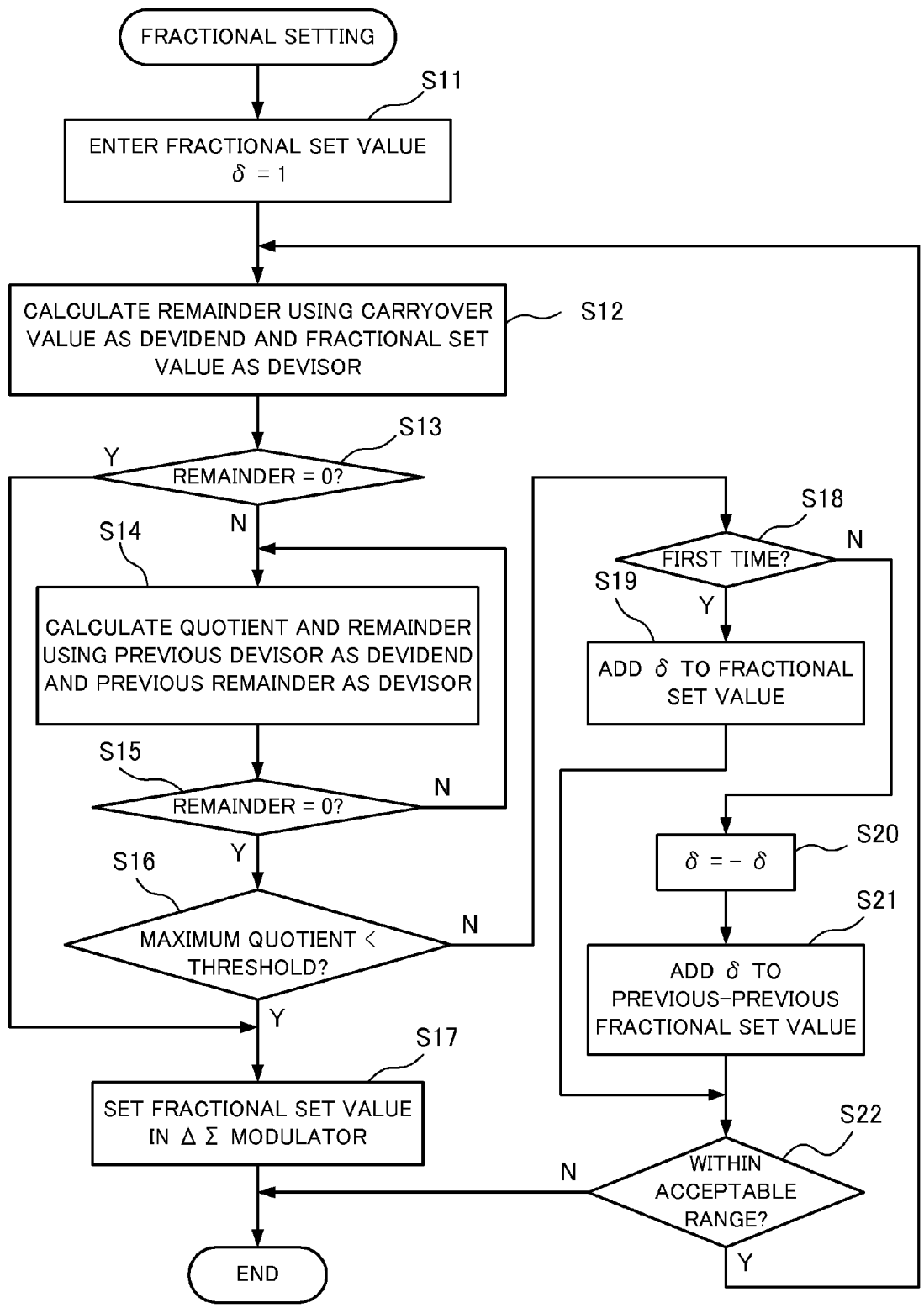
FIG. 4 is a flowchart showing an example of the fractional setting operation according to the embodiment.

FIG. 4 is a flowchart showing an example of the fractional setting operation according to the embodiment. The fractional setter 1 enters a fractional set value determined according to the frequency for the ΔΣPLL 10 to output. Concurrently, the increment δ of the fractional set value is set to +1 (Step S11). The calculator 11 calculates the remainder of the division of which the dividend is the carryover value (the minimum accumulated value at which a carryover occurs) and the devisor is the fractional set value (Step S12). If the remainder is zero (Step S13; Y), no periodic abnormal noise occurs, and the fractional set value is set in the ΔΣ modulator 2 (Step S17).

If the remainder is not zero (Step S13; N), the quotient and remainder of the division of which the dividend is the previous devisor and the devisor is the previous remainder are calculated (Step S14). If the remainder is not zero (Step S15; N), the Step S14 is repeated until the remainder becomes zero (Step S15; Y). When the remainder becomes zero (Step S15; Y), the maximum value of the quotients calculated up to then is compared with a threshold (Step S16). If the maximum quotient value is less than the threshold (Step S16; Y), the fractional set value is determined not to cause periodic abnormal noise and the fractional set value is set in the ΔΣ modulator 2 (Step S17).

If the maximum quotient value is equal to or greater than the threshold (Step S16; N) and if the fractional set value is changed for the first time (Step S18; Y), δ (=1) is added to the fractional set value (Step S19). For the second and subsequent times (Step S18; N), the sign of δ is inverted (Step S20), and δ is added to the previous-previous fractional set value (Step S21). Then, in any case, it is examined whether the new fractional set value falls within an acceptable range (Step S22). If the new fractional set value does not fall within the acceptable range (Step S22; N), the procedure ends without setting the fractional set value in the ΔΣ modulator 2.

If the new fractional set value falls within the acceptable range (Step S22; Y), the processing is repeated from the Step S12 in which the remainder of the division of which the dividend is the carryover value and the devisor is the fractional set value is calculated. In this way, the fractional setter 1 can set in the ΔΣ modulator 2 a fractional set value enabling output of a frequency closest to the frequency for the ΔΣPLL 10 to output among the fractional set values with which the maximum value of the fluctuation rates is less than a threshold.

The fractional setter 1 can be configured by a computer, a PLD (programmable logic device) such as a FPGA (field programmable gate array) or CPLD (complex programmable logic device), a logical circuit using a logical operation element including division and other arithmetic elements, or the like.

For some frequency for the ΔΣPLL 10 to output and its acceptable range and for some threshold for determining that periodic abnormal noise occurs, no fractional set value may be found within the acceptable range to satisfy the threshold for determining the occurrence of periodic abnormal noise. In such a case, the periodic abnormal noise can be minimized by selecting the fractional set value with which the maximum value of the fluctuation rates is the lowest among the fractional set values within the acceptable range of the frequency.

Specific Example

FIG. 5 is a chart showing an exemplary situation in which abnormal noise occurs. In this case, the primary integrator (accumulator) of the ΔΣ modulator 2 has 18 bits. The value causing a carryover (the minimum accumulated value) is $2^{18}=262144$. The primary integrator can have values from 0 to $2^{18}-1=262143$.

In the case of FIG. 5, when the fractional set values are 61681 and 200463, abnormal noise occurs approximately every 400 msec. When the fractional set values are 69391 and 157286, abnormal noise occurs approximately every 200 msec. When the fractional set values are 157287 and 157288, abnormal noise occurs at different intervals, approximately every 130 msec. and approximately every 50 msec., respectively. Furthermore, when the fractional set values are 100000 and 199949, no audible abnormal noise occurs.

FIG. 6 is a chart showing the number of occurrences of periodic fluctuation and the fluctuation rate with the fractional set values in FIG. 5. Here, the number of occurrences of periodic fluctuation is the number of times the envelope described in FIGS. 2A to 2D fluctuates while the primary integrator completes a round of integrations (262144 integrations). The number of occurrences in stage 1 is the remainder obtained by dividing the minimum accumulated value at which a carryover occurs by the fractional set value. The number of occurrences in stage 2 is the remainder obtained by dividing the fractional set value by the first remainder. In the third and subsequent stages, the number of occurrences is the remainder of the division of which the dividend is the devisor in the previous division and the devisor is the remainder in the previous division. The fluctuation rate is the quotient of the above-described division, which is given not in the row of the division but in the row of the number of fluctuations (=the remainder) to which the fluctuation rate corresponds in FIG. 6.

A notable fluctuation rate in FIG. 6 is, for example, the fluctuation rate=15420 for the number of occurrences=1 in the stage 2 under the fractional set value=61681. Other notable fluctuation rates are the fluctuation rate=3854 for the number of occurrences=2 under the fractional set value=69391, the fluctuation rate=26214 for the number of occurrences=2 under the fractional set value=157286, the fluctuation rate=17475 for the number of occurrences=3 under the fractional set value=157287, the fluctuation rate=6553 for the number of occurrences=8 under the fractional set value=157288, and the fluctuation rate=15420 for the number of occurrences=1 under the fractional set value=200463.

In this case, the primary integrator completes a round of integrations (262144 integrations) in approximately 400 msec. The factional set values=61681 and 200463 cause abnormal noise approximately every 400 msec., which corresponds to the fluctuation rate=15420 for the number of occurrences=1.

Abnormal noise that occurs approximately every 200 msec. with the fractional set value=157286 corresponds to the fluctuation rate=26214 for the number of occurrences=2. Abnormal noise that occurs approximately every 130 msec. with the fractional set value=157287 corresponds to the fluctuation rate=17475 for the number of occurrences=3. Additionally, abnormal noise that occurs approximately every 50 msec. with the fractional set value=157288 corresponds to the fluctuation rate=6553 for the number of occurrences=8.

It can be said that the calculation results in FIG. 6 are consistent with the practice in FIG. 5. It is understood from comparison between FIGS. 5 and 6 that for example, the fluctuation rate equal to or greater than a threshold=1000 can be determined to cause abnormal noise. A case of preventing periodic abnormal noise is given below.

FIGS. 7A to 7C are charts showing exemplary fractional set values preventing periodic abnormal noise. In FIGS. 7A to 7C, the fractional set value=69391 is shown among the fractional set values in FIGS. 5 and 6. It is assumed that the fractional set value corresponding to the frequency for the ΔΣPLL 10 to output is 69391. In this case, the threshold for determining that periodic abnormal noise occurs is 1000.

FIG. 7A shows the fluctuation rates calculated with the fractional set value=69391. With the fractional set value=69391, as shown in FIG. 5, abnormal noise occurs approximately every 200 msec. This occurrence of abnormal noise can be determined from the quotient (=the fluctuation rate) 3854 in the sixth row that corresponds to the remainder 2 in the fifth row from the top except for the title in FIG. 7A. Then, the fractional set value is increased/decreased to seek for a value not causing abnormal noise.

FIG. 7B shows the fluctuation rates calculated with the fractional set value increased by one to 69392. With the fractional set value=69392, the fluctuation rate 240 for the remainder (=the number of fluctuations) 32 is the maximum value. This value is less than the threshold; therefore, it is determined that no periodic abnormal noise occurs.

FIG. 7C shows the fluctuation rates calculated with the fractional set value decreased by one to 69390. With the fractional set value=69390, the fluctuation rate 213 for the remainder (=the number of fluctuations) 36 is the maximum value. This value is less than the threshold; therefore, it is determined that no periodic abnormal noise occurs.

It is assumed that the acceptable range of the frequency for the ΔΣPLL 10 to output is ±0.005%. Then, the acceptable range of the fractional set value is approximately ±3. Both the fractional set value=69392 in FIG. 7B and the fractional set value=69390 in FIG. 7C fall within the acceptable range. Therefore, the two can be set in the ΔΣ modulator 2.

As described above, the ΔΣPLL 10 of this embodiment can prevent periodic abnormal noise that occurs based on the relation between the accumulated value causing a carryover and the fractional set value in a fractional N frequency synthesizer.

The present disclosure is preferable for fractional N frequency synthesizers.

The foregoing describes some example embodiments for explanatory purposes. Although the foregoing discussion has presented specific embodiments, persons skilled in the art will recognize that changes may be made in form and detail without departing from the broader spirit and scope of the invention. Accordingly, the specification and drawings are to be regarded in an illustrative rather than a restrictive sense. This detailed description, therefore, is not to be taken in a limiting sense, and the scope of the invention is defined only by the included claims, along with the full range of equivalents to which such claims are entitled.

What is claimed is:

1. A fractional N frequency synthesizer, comprising:
a phase frequency comparator comparing a reference frequency with the phase frequency of an input signal and outputting the difference between the reference frequency and the phase frequency;
a voltage controlled oscillator outputting a clock signal in response to the output of the phase frequency comparator;
a $\Delta\Sigma$ modulator accumulating a fractional set value at each cycle of the reference frequency and generating a carryover signal when the accumulated value exceeds the maximum value of an accumulator in the $\Delta\Sigma$ modulator;
a frequency divider dividing the frequency of the clock signal from the voltage controlled oscillator by a first frequency division value when the carryover signal has been generated by the $\Delta\Sigma$ modulator, at each cycle of the reference frequency, dividing the frequency of the clock signal from the voltage controlled oscillator by a second frequency division value when the carryover signal has not been generated by the $\Delta\Sigma$ modulator, at each cycle of the reference frequency, the second frequency division value being different from the first frequency division value, and using the clock signal with the divided frequency as the input signal to the phase frequency comparator;
a calculator calculating the remainder of the division of which the dividend is the minimum accumulated value at which a carryover occurs in the $\Delta\Sigma$ modulator and the devisor is the fractional set value, and if the remainder is not zero, repeatedly calculating the quotient and remainder of the division of which the dividend is the devisor of the previous division and the devisor is the value of the remainder obtained in the previous division until the value of the remainder becomes zero;
an abnormal noise determiner determining, after the calculator has calculated the quotient and remainder of the division using a fractional set value to be set in the $\Delta\Sigma$ modulator until the remainder has become zero, that the fractional set value causes periodic abnormal noise when the calculated quotients include a value exceeding a threshold and determining that the fractional set value does not cause periodic abnormal noise when the calculated quotients do not include a value exceeding the threshold; and
a fractional setter, comprising the calculator and the abnormal noise determiner, changing the fractional set value to the extent that the frequency of the clock signal eventually obtained by the voltage controlled oscillator does not exceed a given value when the abnormal noise determiner has determined that periodic abnormal noise has occurred, and setting the changed fractional set value as the fractional set value of the $\Delta\Sigma$ modulator when the abnormal noise determiner has determined that the changed fractional set value has not caused periodic abnormal noise.

2. The fractional N frequency synthesizer according to claim 1, wherein the fractional setter incrementally increases or decreases the fractional set value by one when the abnormal noise determiner has determined that periodic abnormal noise has occurred, the abnormal noise determiner continues to determine whether periodic abnormal noise occurs, and the fractional set value is set as the fractional set value of the $\Delta\Sigma$ modulator when it has been determined that no periodic abnormal noise has occurred.

3. A fractional N frequency synthesizer setting method executed by a fractional N frequency synthesizer comprising:
a phase frequency comparator comparing a reference frequency with the phase frequency of an input signal and outputting the difference between the reference frequency and the phase frequency;
a voltage controlled oscillator outputting a clock signal in response to the output of the phase frequency comparator;
a $\Delta\Sigma$ modulator accumulating a fractional set value at each cycle of the reference frequency and generating a carryover signal when the accumulated value exceeds the maximum value of an accumulator in the $\Delta\Sigma$ modulator; and
a frequency divider dividing the frequency of the clock signal from the voltage controlled oscillator by a first frequency division value when the carryover signal has been generated by the $\Delta\Sigma$ modulator, at each cycle of the reference frequency, dividing the frequency of the clock signal from the voltage controlled oscillator by a second frequency division value when the carryover signal has not been generated by the $\Delta\Sigma$ modulator, at each cycle of the reference frequency, the second frequency division value being different from the first frequency division value, and using the clock signal with the divided frequency as the input signal to the phase frequency comparator,
wherein the method comprises:
a calculation step of calculating the remainder of the division of which the dividend is the minimum accumulated value at which a carryover occurs in the $\Delta\Sigma$ modulator and the devisor is the fractional set value, and if the remainder is not zero, repeatedly calculating the quotient and remainder of the division of which the dividend is the devisor of the previous division and the devisor is the value of the remainder obtained in the previous division until the value of the remainder becomes zero;
an abnormal noise determination step of determining, after the quotient and remainder of the division have been calculated using a fractional set value to be set in the $\Delta\Sigma$ modulator until the remainder has become zero in the calculation step, that the fractional set value causes periodic abnormal noise when the calculated quotients include a value exceeding a threshold, and determining that the fractional set value does not cause periodic abnormal noise when the calculated quotients do not include a value exceeding the threshold; and
a fractional setting step, comprising the calculation step and the abnormal noise determination step, the fractional setting step changing the fractional set value to the extent that the frequency of the clock signal eventually obtained by the voltage controlled oscillator does not exceed a given value when it has been determined in the abnormal noise determination step that periodic abnormal noise has occurred, and setting the changed fractional set value as the fractional set value of the $\Delta\Sigma$ modulator when it has been determined in the abnormal noise determination step that the changed fractional set value has not caused periodic abnormal noise.

4. The fractional N frequency synthesizer setting method according to claim 3, wherein in the fractional setting step, the fractional set value is incrementally increased or decreased by one when it has been determined in the abnormal noise determination step that periodic abnormal noise has occurred, it is continued to determine in the abnormal noise determination step whether periodic abnormal noise occurs, and the fractional set value is set as the fractional set value of the $\Delta\Sigma$ modulator when it has been determined that no periodic abnormal noise has occurred.

* * * * *

UNITED STATES PATENT AND TRADEMARK OFFICE
CERTIFICATE OF CORRECTION

PATENT NO. : 9,584,142 B2
APPLICATION NO. : 14/596525
DATED : February 28, 2017
INVENTOR(S) : Yasuo Ueno et al.

It is certified that error appears in the above-identified patent and that said Letters Patent is hereby corrected as shown below:

On the Title Page

Item (73) Assignee:
"Icom Incorporated, Osaka (JP)"

Should be:
--Icom Incorporated, Osaka (JP);
LAPIS Semiconductor Co., Ltd., Yokohama (JP)--

Signed and Sealed this
Twenty-fourth Day of October, 2017

Joseph Matal
*Performing the Functions and Duties of the*
*Under Secretary of Commerce for Intellectual Property and*
*Director of the United States Patent and Trademark Office*